United States Patent
Haran et al.

(10) Patent No.: US 10,048,488 B2
(45) Date of Patent: Aug. 14, 2018

(54) CIRCUIT FOR DETECTION OF FAILURE OF MOVABLE MEMS MIRROR

(71) Applicant: STMicroelectronics Ltd, Netanya (IL)

(72) Inventors: Elik Haran, Kfar Saba (IL); Gilad Adler, Herzeliya (IL)

(73) Assignee: STMicroelectronics Ltd, Netanya (IL)

( * ) Notice: Subject to any disclaimer, the term of this patent is extended or adjusted under 35 U.S.C. 154(b) by 0 days.

(21) Appl. No.: 15/348,087

(22) Filed: Nov. 10, 2016

(65) Prior Publication Data

US 2018/0129036 A1     May 10, 2018

(51) Int. Cl.
| | |
|---|---|
| *G02B 26/12* | (2006.01) |
| *G02B 26/08* | (2006.01) |
| *G02B 26/10* | (2006.01) |
| *B81B 3/00* | (2006.01) |
| *G01R 31/28* | (2006.01) |

(52) U.S. Cl.
CPC .......... *G02B 26/085* (2013.01); *B81B 3/0059* (2013.01); *G01R 31/2829* (2013.01); *G02B 26/105* (2013.01); *B81B 2201/042* (2013.01)

(58) Field of Classification Search
CPC .. G02B 26/085; G02B 26/105; G02B 26/101; G02B 26/10; H02K 33/16
USPC ............................................ 359/199.1–199.4
See application file for complete search history.

(56) References Cited

U.S. PATENT DOCUMENTS

| | | | |
|---|---|---|---|
| 5,841,537 A | 11/1998 | Doty | |
| 6,788,520 B1 * | 9/2004 | Behin | .................... G02B 6/358 361/207 |
| 6,856,400 B1 | 2/2005 | Froggatt | |
| 7,277,606 B1 * | 10/2007 | Sakai | .................... G02B 6/359 385/17 |
| 9,740,002 B2 * | 8/2017 | Kolodkin | ........... G02B 26/0841 |
| 2008/0050064 A1 | 2/2008 | Sakai et al. | |
| 2009/0185251 A1 * | 7/2009 | Chen | .................... G02B 26/101 359/199.3 |
| 2016/0255318 A1 | 9/2016 | Chevallaz et al. | |

* cited by examiner

*Primary Examiner* — Mohammed Hasan
(74) *Attorney, Agent, or Firm* — Crowe & Dunlevy (57) ABSTRACT

Disclosed herein is a circuit for determining failure of a movable MEMS mirror. The circuit includes a mirror position sensor associated with the movable MEMS mirror and that generates an analog output as a function of angular position of the movable MEMS mirror. An analog to digital converter converts the analog output from the mirror position sensor to a digital mirror sense signal. Failure detection circuitry calculates a difference between the digital mirror sense signal at a first instant in time and the digital mirror sense signal at a second instant in time, determines whether the difference exceeds a threshold, and indicates failure of the movable MEMS mirror as a function of the difference failing to exceed the threshold.

21 Claims, 7 Drawing Sheets

CIRCUIT FOR DETECTION OF FAILURE OF MOVABLE MEMS MIRROR

TECHNICAL FIELD

This disclosure relates to MEMS mirrors for scanning or deflecting light beams, and, in particular, to techniques and circuits for determining when MEMS mirrors have experienced failures.

BACKGROUND

Certain devices such as wafer defect scanners, laser printers, document scanners, projectors and the like often employ a collimated laser beam that scans across a flat surface in a straight line path. These devices employ tilting mirrors to deflect the beam to perform the scanning. These tilting mirrors may be, or may include, Micro Electro Mechanical Systems ("MEMS") devices. The actuation of mirrors used in MEMS devices, referred to herein as MEMS mirrors, can be via the electromagnetic, electrostatic, piezoelectric, and thermoelectric effects, depending on application.

One type of common MEMS mirror includes a stator and a rotor, with the rotor or structures carried by the rotor being reflective. The stator and/or rotor are driven with a drive signal which results in the rotor oscillating with respect to the stator, thereby changing the angle of reflectance of an incident light beam on the rotor. By oscillating the rotor between two orientations, an opening angle of the mirror is defined, and scanning of the light beam across the flat surface is accomplished.

If a MEMS mirror fails, such as when the rotor undesirably becomes stuck, the laser beam may shine in a fixed direction rather than be oscillating at a high frequency. Where a laser beam becomes fixed, particularly when the laser is of a high power, damage can result to surfaces that the laser shines onto. This damage can occur in a very short period of time, thus it is desirable to not only be able to detect when a MEMS mirror fails so that the laser beam can be switched off, but to detect that failure of the MEMS mirror as quickly as possible.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a circuit for determining failure of a movable MEMS mirror, with a response time faster than a single period of oscillation of the movable MEMS mirror. The circuit includes a mirror position sensor associated with the movable MEMS mirror and that generates an analog output as a function of angular position of the movable MEMS mirror. An analog to digital converter converts the analog output from the mirror position sensor to a digital mirror sense signal. Failure detection circuitry calculates a difference between the digital mirror sense signal at a first instant in time and the digital mirror sense signal at a second instant in time, determines whether the difference exceeds a threshold, and indicates failure of the movable MEMS mirror as a function of the difference failing to exceed the threshold.

Another aspect is directed to a circuit including an analog to digital converter receiving an analog output of from a mirror position sensor as input. A plurality of registers receive output from the analog to digital converter as input. At least one subtractor receives outputs from the plurality of registers as input. At least one comparator receives the output from the at least one subtractor and a threshold signal as input.

A method aspect includes operating a movable MEMS mirror, and generating an analog signal that is a function of a position of the movable MEMS mirror in real time as the movable MEMS mirror is in operation. The analog signal is converted to a digital mirror sense signal in real time as the movable MEMS mirror is in operation. A signal that is a function of a rotational speed of the movable MEMS mirror at one or more instants is determined in time in real time as the movable MEMS mirror is in operation. It is determined whether the signal fails to exceed a threshold in real time as the movable MEMS mirror is in operation. The threshold reflects a minimal desired difference between 2 samples instants of the movement of the MEMS mirror.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, and reference numbers separated by century, as well as reference numbers with prime notation, indicate similar elements in other applications or embodiments.

Figure 1:
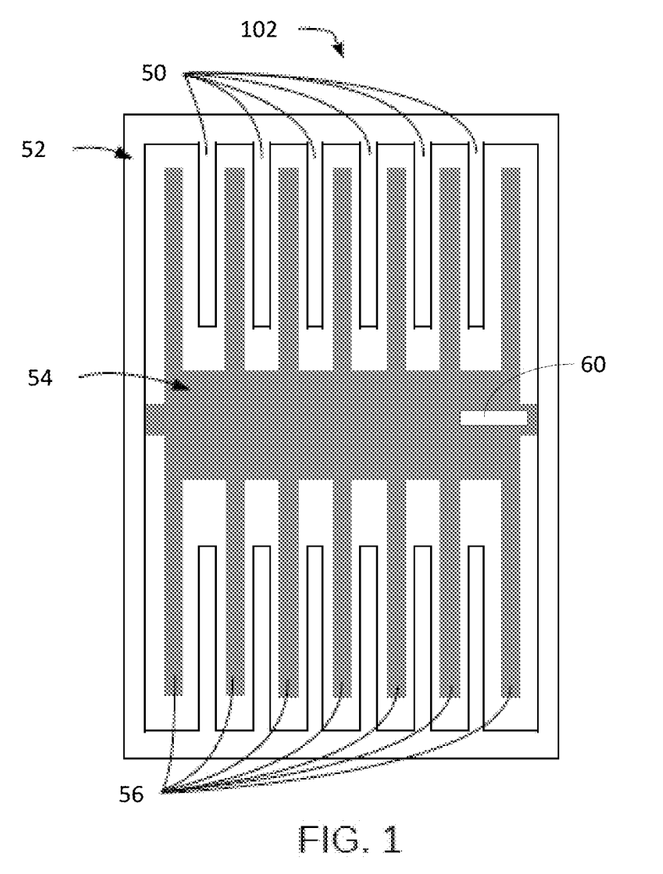
FIG. 1 is a top plan view of a movable MEMS mirror as may be used with the techniques described in this disclosure.

First, a movable MEMS mirror 102, such as may be used in devices such as wafer defect scanners, laser printers, document scanners, projectors, and pico-projectors, will now be described with reference to FIG. 1. The movable MEMS mirror 100 includes a stator 52 having inwardly projecting fingers 50. A rotor 54 is positioned within the stator 52 and has outwardly projecting fingers 56 that interleave with the inwardly projecting fingers 50 of the stator 52. The rotor 54 spins about its axis, rotating its mirror surface with respect to the stator 52.

Either the stator 52 or the rotor 54 is supplied with a periodic signal, such as a square wave, while the other is supplied with a reference voltage. In the case where the periodic signal has an oscillating square voltage, for example, electrostatic forces cause the rotor 54 to rotate about its axis relative to the stator 52. In the case where the periodic signal has an oscillating square current, for example, magnetic forces cause the rotor 54 to rotate about its axis relative to the stator 52. Indeed, the movable MEMS mirror 102 may be driven according to any suitable way known to those of skill in the art, such as through the use of the piezoelectric effect of thermoelectric effect. Thus, it should be understood that the techniques, circuits, and methods described herein are applicable to any movable MEMS mirror 102, regardless of how it is driven.

Figure 2:
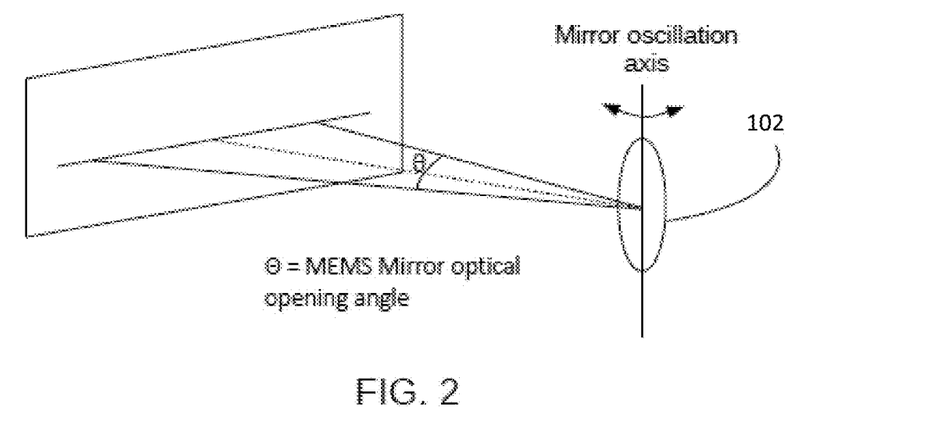
FIG. 2 is a perspective view showing operation of a movable MEMS mirror scanning in accordance with the techniques described in this disclosure.

For use in scanning a light beam across a surface, the movable MEMS mirror 102 is driven so that it oscillates at its resonant frequency between two set or controllable rotation limits. The movable MEMS mirror 102 may be driven to a resonance frequency of 20 KHz, for example. Shown in FIG. 2 is the movable MEMS mirror 102 scanning a light beam across a projection screen between two set rotation limits that define an "opening angle" θ of the movable MEMS mirror 102.

Referring back to FIG. 1, a mirror position sensor 60, such as a piezoelectric resistor bridge, may be associated with the rotor 54 and generate an opening angle signal as a function of the opening angle of the movable MEMS mirror 102. Alternatively, the opening angle may be generated as a function of the capacitance between the rotor 54 and stator 52, using a capacitance to voltage converter or other suitable circuit.

This opening angle signal will be used by a circuit 100 for detecting failure of the movable MEMS mirror 102, as will now be described with reference to FIGS. 3-4. As explained earlier, is it highly desirable to detect failure of the movable MEMS mirror 102 as quickly as possible. For example, it may be desirable to detect failure within 1000 ns, or in some cases within 400 ns.

As stated, the circuit 100 includes a mirror position sensor 60 associated with the movable MEMS mirror 102. This mirror position sensor 60 generates an analog output 105 as a function of position of the movable MEMS mirror 102. This analog output 105 will be in the form of a wave, such as a sinusoid.

Figure 5:
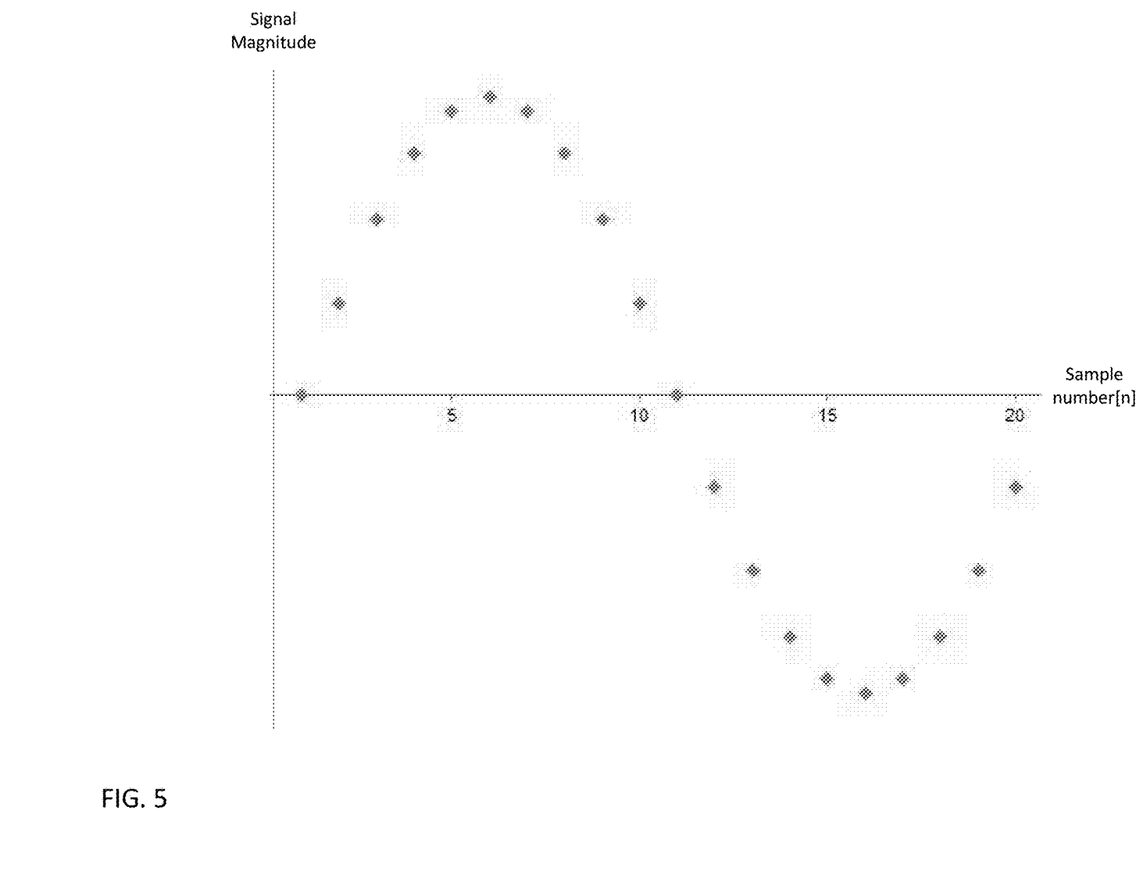
FIG. 5 is a graph showing digitization of the analog signal output by the mirror position sensor of FIGS. 3-4.

An analog to digital converter 106 converts the analog output 105 from the mirror position sensor 60 to a digital mirror sense signal 107. The sampling period of the analog to digital converter 106 is desirably no more than the period of time in which it is desirable to determine failure of the movable MEMS mirror 102, and in some cases, desirably no more than half the period of time in which it is desirable to determine failure of the movable MEMS mirror 102. For example, where it is desirable to determine failure of the movable MEMS mirror 102 within 800 ns, the analog to digital converter may have a sampling period of 800 ns, or 400 ns. A graph of output 107 of the analog to digital converter 106 is shown in FIG. 5.

Each sample can be computed as:

$$\text{Sample}[n] = A * \sin(2\pi f t),$$

where $f$ is the resonance frequency of the mirror, where $t = n*\Delta T$, with $\Delta T$ being the sampling period.

Failure detection circuitry 101 receives the digital mirror sense signal 107 and generates an indication 125 that the movable MEMS mirror has failed 102 based on analysis thereof. Details of the failure detection circuitry 101 will now be given.

The failure detection circuitry 101 includes two registers 108 and 110 coupled in series, with the register 108 directly receiving the digital mirror sense signal 107. The registers 108, 110 are clocked by clock signal CLK synchronously with one another and with the analog to digital converter 106. Thus, as a sample[n] is output from the analog to digital converter 106, it is stored in the register 108; at the same time, the sample[n−1] that was stored in the register 108 is shifted into the register 110.

Figure 6A:
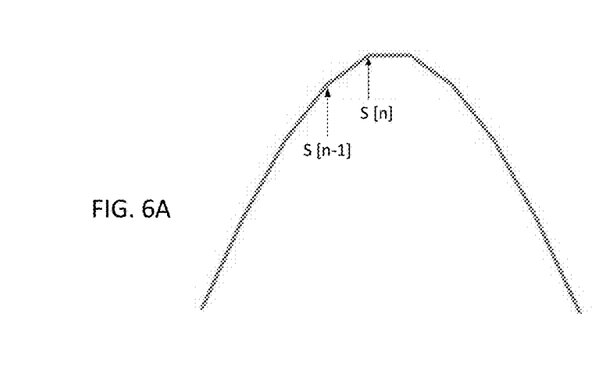
FIGS. 6A and 6B are graphs showing the determination of rotation speed of the movable MEMS mirror from two samples of the mirror position.

A subtractor 114 receives as input sample[n] from the register 108 and sample[n−1] from register 110, subtracts sample[n−1] from sample[n], and outputs the difference to an absolute value block 119 which returns the absolute value of the difference as signal 109. By dividing the resulting difference by the sampling period, the speed of the rotation of the movable MEMS mirror 102 at time t can be determined. The selection of sample[n] and sample[n−1] is shown in FIG. 6A. Mathematically, this calculation can be represented as:

$$\text{Speed}[t] = \frac{\text{Sample}[n] - \text{Sample}[n-1]}{\Delta T}$$

By comparing the absolute value of calculated speed[t] to a threshold speed below which it can be concluded that the movable MEMS mirror 102 has failed, failure of the movable MEMS mirror 102 can be detected. So as to enable easier calculation, however, a comparator 118 can be used to directly compare the difference between Sample[n] and Sample[n−1] to a threshold THR, without directly calculating the Speed[t]. To that end, comparator 118 receives signal 109 at its non-inverting input and the threshold signal THR at its inverting input, and provides an output 113 indicating whether the difference between sample[n] and sample[n−1] is greater than the threshold THR. Where the difference between sample[n] and sample[n−1] is not greater than THR, it can be concluded that the speed of the MEMS mirror 102 is such that the MEMS mirror 102 has failed. Mathematically, a failure condition can be represented as:

$$\text{ABS}\{\text{Sample}[n] - \text{Sample}[n-1]\} < \text{THR}$$

The output 113 from the comparator is fed to the data input of flip flop 124. Flip flop 124 is clocked synchronously with the registers 108 and 110 by the clock signal CLK as explained above. Therefore, at each clock cycle (and thus each sample[n] taken by the analog to digital converter 106), the flop flop 124 outputs the indication 125 of whether the movable MEMS mirror 102 has failed.

Figure 6B:
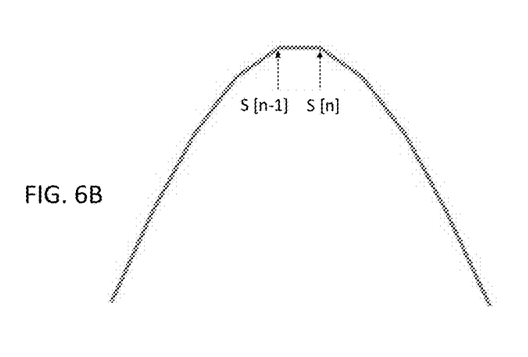

While the failure detection circuit 101 of the device 100 is capable of swiftly and accurately determining whether the movable MEMS mirror 102 has failed, should sample[n−1] and sample[n] be taken at equidistant points from a peak of the analog output 105 from the mirror position sensor 104, as shown in FIG. 6B, the difference between the two would be zero, which would be less than THR and could thus falsely indicate failure of the movable MEMS mirror.

Therefore, a further embodiment of the device 100', and in particular the failure detection circuit 101', is now described with reference to FIG. 4. The movable MEMS mirror 102, position sensor 104, and analog to digital converter 106 are as described above and need no further description.

The failure detection circuitry 101' receives the digital mirror sense signal 107 and generates an indication 125 that the movable MEMS mirror has failed 102 based on analysis thereof. The failure detection circuitry 101' includes three registers 108, 110, and 112 coupled in series, with the register 108 directly receiving the digital mirror sense signal 107. The registers 108, 110, and 112 are clocked by clock signal CLK synchronously with one another and with the analog to digital converter 106. Thus, as a sample[n] is output from the analog to digital converter 106, it is stored in the register 108; at the same time, the sample[n−1] that was stored in the register 108 is shifted into the register 110; similarly, at the same time, the sample[n−2] that was stored in the register 110 is shifted into the register 112.

Figure 7:
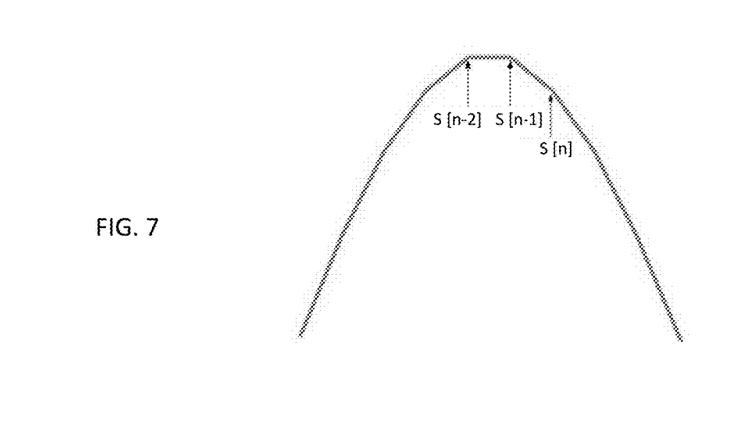
FIG. 7 is a graph showing the determination of rotation speed of the movable MEMS mirror from three samples of the mirror position.

The subtractor 114 receives as input sample[n] from the register 108 and sample[n−1] from register 110, subtracts sample[n−1] from sample[n], and outputs the difference to absolute value block 119, which outputs the absolute value of the difference as signal 109. Similarly, subtractor 116 receives as input the sample[n−1] and sample[n−2], subtracts sample[n−2] from sample[n−1], and outputs the difference to absolute value block 121, which outputs the absolute value of the difference as signal 113. As shown in FIG. 7, by collecting three samples of the analog signal 105, at least one of the calculated differences would be nonzero during proper operation of the movable MEMS mirror 102 (and the signals 109 and 111 will indicate as such).

Thus, comparator 118 receives signal 109 at its non-inverting input and the threshold signal THR at its inverting input, and provides an output 113 indicating whether the difference between the absolute values of sample[n] and sample[n−1] is greater than the threshold THR. Comparator 120 receives signal 111 at its non-inverting input and the threshold signal THR at its inverting input, and provides an output 126 indicating whether the difference between the absolute values of sample[n−1] and sample[n−2] is greater than the threshold THR. Where the difference between both the absolute values of sample[n] and sample[n−1], as well as the absolute values of sample[n−1] and sample[n−2], is not greater than THR, it can be concluded that the speed of the MEMS mirror 102 is such that the MEMS mirror 102 has failed. Mathematically, a failure condition can be represented as:

$$[ABS\{(Sample[n]-Sample[n-1])\}<THR] \&\& [ABS\{(Sample[n-1]-Sample[n-2])\}<THR]$$

This is implemented by the output 113 from the comparator 118 and output 126 from comparator 120 being passed as inputs to the AND gate 122, which provides its output 127 to the data input of flip flop 124. Flip flop 124 is clocked synchronously with the registers 108, 110, and 112 by the clock signal CLK as explained above. Therefore, at each clock cycle (and thus each sample[n] taken by the analog to digital converter 106), the flop flop 124 outputs the indication 125 of whether the movable MEMS mirror 102 has failed.

Figure 3:
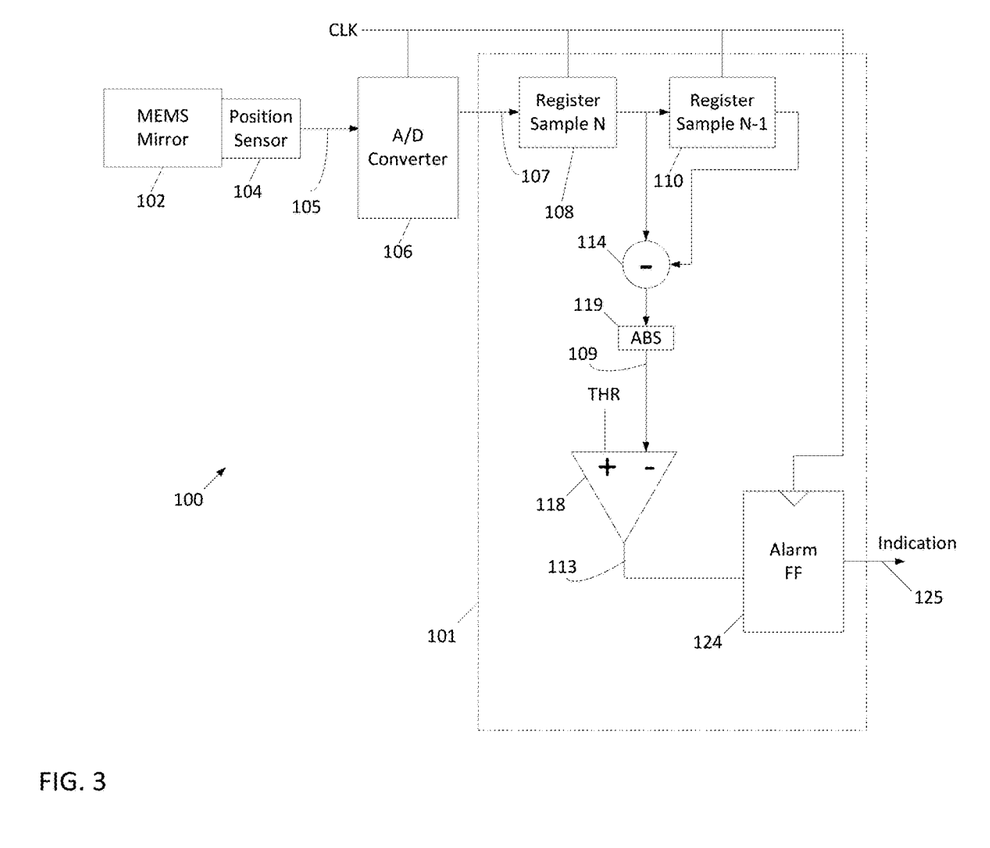
FIG. 3 is a schematic block diagram of a circuit for detecting failure of a movable MEMS mirror in accordance with this disclosure.
Figure 4:
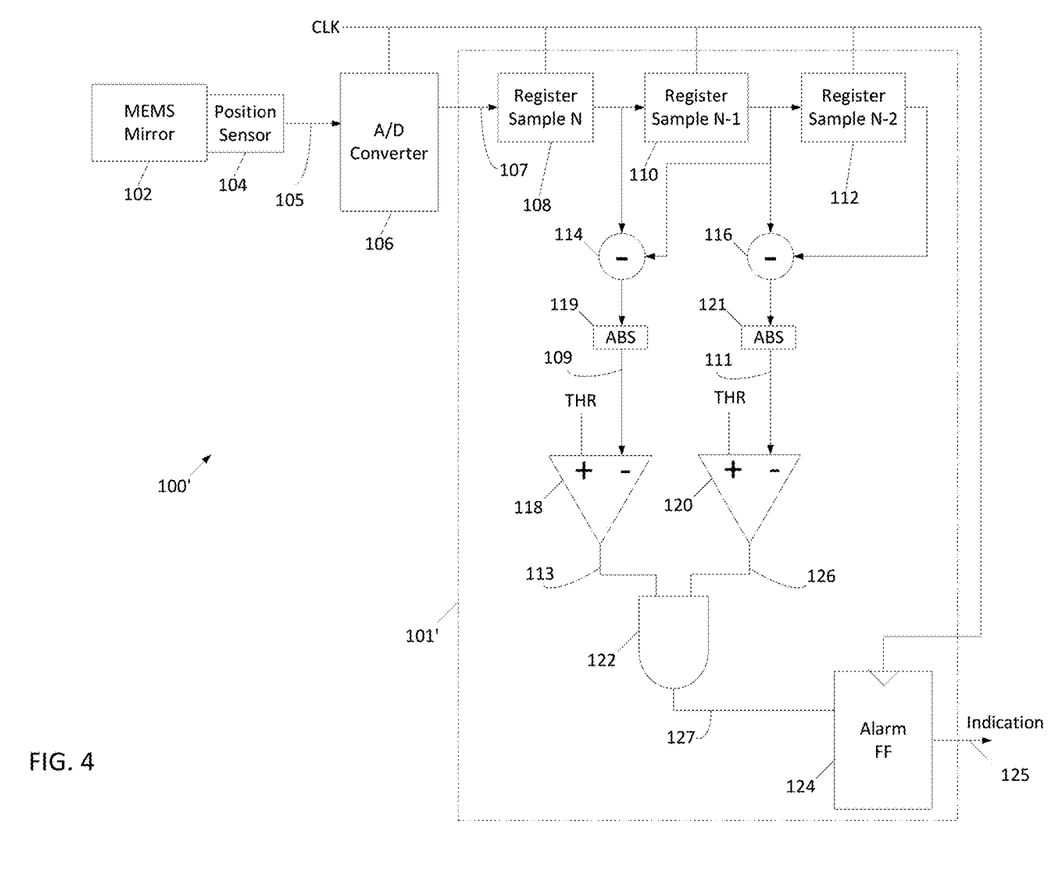
FIG. 4 is a schematic block diagram of a further configuration of circuit for detecting failure of a movable MEMS mirror in accordance with this disclosure.

By setting the sampling rate to one half to that of the desired time in which to detect failure of the movable MEMS mirror 102, the circuit 100 of FIG. 3 can provide suitable performance within that desired time by taking and processing two samples. Likewise, by setting the sampling rate to one third of that of the desired time in which to detect failure of the movable MEMS mirror 102, the circuit 100' of FIG. 4 can provide suitable performance within that desired time by taking and processing three samples.

Figure 8:
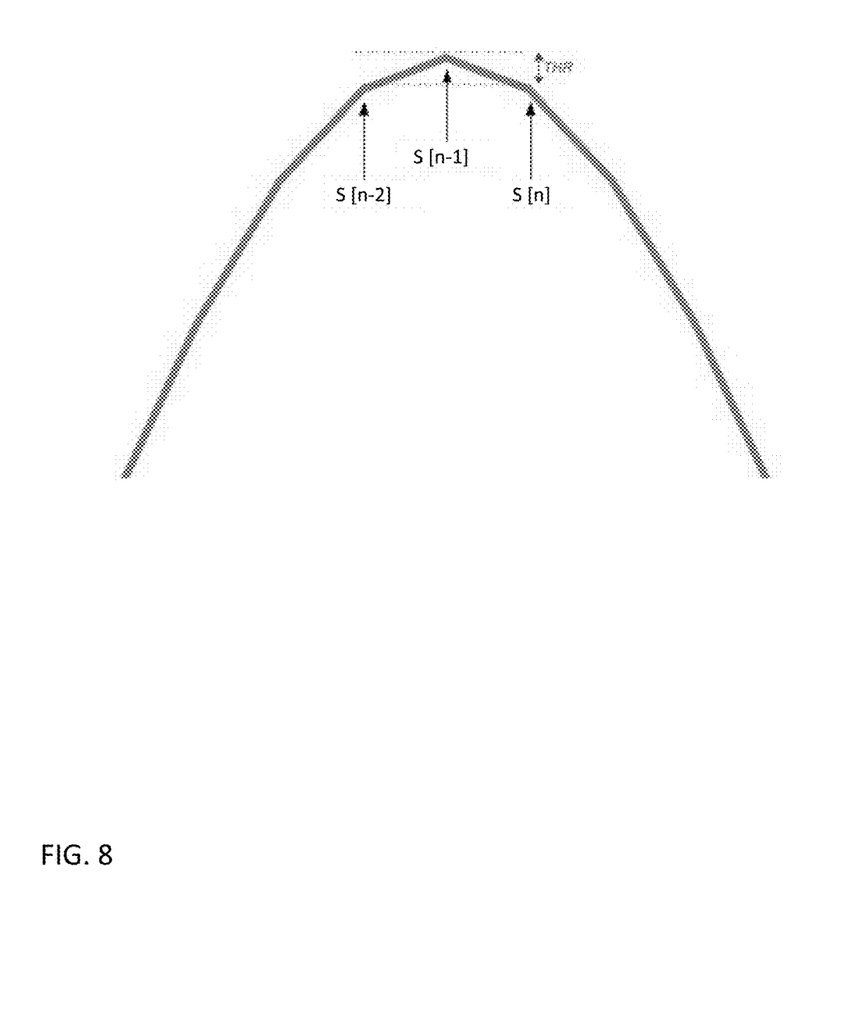
FIG. 8 is a graph showing determination of the threshold value for rotation speed of the movable MEMS mirror.

The value of the threshold THR is set so as to what would be the lowest of three consecutive values of the digital mirror sense signal 107 acquired at the acquisition rate of the analog to digital converter 106, if the second sample were acquired at a sinusoid peak. This is shown in FIG. 8.

As should be appreciated, the circuits 100, 100' may be configured so as to determine failure of the movable MEMS mirror 102 based on more than three samples, although this serves to increase complexity, and may be impractical due to design limitations of the analog to digital converter 102 and the desired time in which to determine that the movable MEMS mirror 102 has failed.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit for determining failure of a movable MEMS mirror, comprising:
    a mirror position sensor associated with the movable MEMS mirror and configured to generate an analog output as a function of angular position of the movable MEMS mirror;
    an analog to digital converter configured to convert the analog output from the mirror position sensor to a digital mirror sense signal; and
    failure detection circuitry configured to:
        calculate a difference between the digital mirror sense signal at a first instant in time and the digital mirror sense signal at a second instant in time;
        determine whether the difference exceeds a threshold; and
        indicate failure of the movable MEMS mirror as a function of the difference failing to exceed the threshold;
        wherein failure of the mirror occurs when the movable MEMS mirror becomes physically stuck.

2. The circuit of claim 1, wherein the failure detection circuitry is further configured to determine from the difference a rotational speed of the movable MEMS mirror; wherein determining whether the difference exceeds a threshold comprises determining whether the rotational speed exceeds a threshold; and wherein indicating failure of the movable MEMS mirror comprises indicating failure of the movable MEMS mirror as a function of the rotational speed failing to exceed the threshold.

3. The circuit of claim 1, wherein the failure detection circuitry is further configured to store values of the digital mirror sense signal; and wherein the failure detection circuit is configured to determine the difference as a function of the stored values.

4. The circuit of claim 1, wherein the failure detection circuitry is configured to:
    determine from the digital mirror sense signal first and second differences, the first difference being between the digital mirror sense signal at a first instant in time and the digital mirror sense signal at a second instant in time, the second difference being between the digital mirror sense signal at the second instant in time and the digital mirror sense signal at a third instant in time;
determine whether at least one of the first and second differences exceeds the threshold; and
indicate failure of the movable MEMS mirror as a function of at least one of the first and second differences failing to exceed the threshold.

5. The circuit of claim 1, wherein the analog to digital converter has a sampling rate, wherein the threshold is less than a lowest of at least two consecutive values of the digital mirror sense signal converted at the sampling rate, and wherein a second of the two consecutive values is acquired at a peak of the analog output.

6. The circuit of claim 1, wherein the analog to digital converter has a sampling rate, wherein the threshold is less than a lowest of three consecutive values of the digital mirror sense signal converted at the sampling rate, and wherein a second of the three consecutive values is acquired at a peak of the analog output.

7. The circuit of claim 1, wherein the failure detection circuitry comprises:
storage circuitry configured to store values of the digital mirror sense signal;
speed determination circuitry configured to determine from the stored values of the digital mirror sense signal one or more speed values that are a function of a rotational speed of the movable MEMS mirror at one or more instants in time;
comparison circuitry configured to determine whether the one or more speed values exceeds the threshold; and
indicator circuitry configured to indicate the failure of the movable MEMS mirror as a function of the one or more speed values at the one or more instants in time failing to exceed the threshold.

8. The circuit of claim 7, wherein the storage circuitry comprises a plurality of registers configured to store consecutive values of the digital mirror sense signal.

9. The circuit of claim 7, wherein the speed determination circuitry comprises at least one subtractor configured to determine the one or more speed values as a function of a difference between a given stored value of the digital mirror sense signal and a preceding stored value of the digital mirror sense signal.

10. The circuit of claim 7, wherein the comparison circuitry comprises a first comparator having inputs receiving the one or more speed values and the threshold, and an output.

11. The circuit of claim 10, wherein the comparison circuit further comprises:
a second comparator having inputs receiving another of the one or more speed values and the threshold, and an output; and
an AND gate receiving as input the outputs from the first and second comparators, and providing output to the indicator circuit.

12. The circuit of claim 7, wherein the indicator circuit comprises a flip flop receiving output from the comparison circuitry, and selectively indicating the failure of the movable MEMS mirror as a function thereof.

13. The circuit of claim 1, wherein failure of the mirror occurs when the movable MEMS mirror becomes physically stuck, as indicated by the difference failing to exceed the threshold for an extended period of time that suggests that the movable MEMS mirror is no longer oscillating.

14. A method, comprising:
operating a movable MEMS mirror;
generating an analog signal that is a function of a position of the movable MEMS mirror in real time as the movable MEMS mirror is in operation;
converting the analog signal to a digital mirror sense signal in real time as the movable MEMS mirror is in operation;
determine a signal that is a function of a rotational speed of the movable MEMS mirror at one or more instants in time in real time as the movable MEMS mirror is in operation; and
determine whether the signal fails to exceed a threshold in real time as the movable MEMS mirror is in operation, thereby indicating whether the rotational speed of the movable MEMS mirror fails to exceed a threshold rotational speed.

15. The method of claim 14, further comprising stopping operation of the movable MEMS mirror as a function of the signal failing to exceed the threshold.

16. The method of claim 15, wherein the signal is determined at two instants in time; and wherein operation of the movable MEMS mirror is stopped as a function of the signal at the two instants in time failing to exceed the threshold.

17. The method of claim 16, further comprising storing first, second, and third consecutive values of the digital mirror sense signal; and wherein the signal is determined at a first instant in time by subtracting the first value of the digital mirror sense signal from the second value of the digital mirror sense signal, and at a second instant in time by subtracting the second value of the digital mirror sense signal from the third value of the digital mirror sense signal.

18. The method of claim 17, wherein operation of the movable MEMS mirror is stopped as a function of the signal at the first and second instants in time failing to exceed the threshold.

19. The method of claim 14, further comprising determining that the movable MEMS mirror has failed as a function of the signal failing to exceed the threshold.

20. A circuit for determining failure of a movable MEMS mirror, comprising:
a mirror position sensor associated with the movable MEMS mirror and configured to generate an analog output as a function of angular position of the movable MEMS mirror;
an analog to digital converter configured to convert the analog output from the mirror position sensor to a digital mirror sense signal; and
failure detection circuitry configured to:
calculate a difference between the digital mirror sense signal at a first instant in time and the digital mirror sense signal at a second instant in time;
determine from the difference a rotational speed of the movable MEMS mirror;
determine whether the rotational speed exceeds a threshold; and
indicate failure of the movable MEMS mirror as a function of the rotational speed failing to exceed the threshold.

21. A circuit for determining failure of a movable MEMS mirror, comprising:
a mirror position sensor associated with the movable MEMS mirror and configured to generate an analog output as a function of angular position of the movable MEMS mirror;

an analog to digital converter configured to convert the analog output from the mirror position sensor to a digital mirror sense signal; and failure detection circuitry configured to:

determine from the digital mirror sense signal first and second differences, the first difference being between the digital mirror sense signal at a first instant in time and the digital mirror sense signal at a second instant in time, the second difference being between the digital mirror sense signal at the second instant in time and the digital mirror sense signal at a third instant in time;

determine whether at least one of the first and second differences exceeds the threshold; and indicate failure of the movable MEMS mirror as a function of at least one of the first and second differences failing to exceed the threshold.

* * * * *